United States Patent [19]

Ramachandran

[11] Patent Number: 4,498,969
[45] Date of Patent: Feb. 12, 1985

[54] SPUTTERING APPARATUS AND METHOD

[75] Inventor: Kovilvila Ramachandran, Ottawa, Canada

[73] Assignee: Canadian Patents and Development Limited-Societe Candienne des Brevets et D'Exploitation (Limitee, Ottawa, Canada

[21] Appl. No.: 552,820

[22] Filed: Nov. 17, 1983

[30] Foreign Application Priority Data

Nov. 18, 1982 [CA] Canada .................................. 415862

[51] Int. Cl.$^3$ .............................................. C23C 15/00
[52] U.S. Cl. ................................. 204/298; 204/192 R
[58] Field of Search ........................... 204/298, 192 R

[56] References Cited

U.S. PATENT DOCUMENTS 4,221,652 9/1980 Kuriyama ........................... 204/298
4,309,266 1/1982 Nakamura et al. ................. 204/298

FOREIGN PATENT DOCUMENTS 1464384 9/1977 United Kingdom .

Primary Examiner—Arthur P. Demers
Attorney, Agent, or Firm—James C. Wray

[57] ABSTRACT

A apparatus and method is described for the magnetron sputtering of a workpiece to deposit a thin metallic film. A rotating magnetic field is provided in the vicinity of the workpiece to produce higher yield from a given cathode target.

7 Claims, 7 Drawing Figures

SPUTTERING APPARATUS AND METHOD

BACKGROUND OF THE INVENTION

This invention relates to an apparatus and a method for depositing metal on a substrate by a cathode sputtering technique.

In sputtering apparatus, the vaporizing of the material of a cathode into a mass of metallic atoms by the bombardment of gas ions is referred to as a glow discharge. A number of the atoms are scattered and adhere to the surface of a workpiece positioned in the vicinity of the anode to form a metallic film thereon.

In the U.S. Pat. Nos. 4,221,652 (Sept. 9, 1980-N. Kuriyama) and 4,282,083 (Aug. 4, 1981-G. Kertesz and G. Vago), a magnetic field is used in the sputtering apparatus. However in such sputtering apparatus the target tends to wear out and it is desirable to increase the time before the target wears out so as to give a higher yield.

SUMMARY OF THE INVENTION

It is an object of the present invention to provide sputtering apparatus and a method for sputtering in which a higher yield is obtained from the target and a longer time of operation can be obtained between target replacements.

According to one aspect of the invention there is provided sputtering apparatus adapted to form a metallic film on a workpiece, comprising a magnetron sputter device for establishing a glow discharge, a cathode target of material to be sputtered so as to coat at least part of said workpiece with said material, an anode at a different potential to said cathode target to form an electric field therebetween, a magnet adjacent said cathode target, an assembly supporting said magnet and capable of rotating said magnet to produce a rotating magnetic field in the vicinity of said cathode target and said workpiece.

According to another aspect there is provided a method of forming a metallic film on a workpiece including the steps of magnetron sputtering a cathode target and establishing a glow discharge, establishing an electric field in the vicinity of said cathode target, establishing a magnetic field in the vicinity of said cathode target, and rotating said magnetic field.

DESCRIPTION OF PREFERRED EMBODIMENTS

Figure 1:
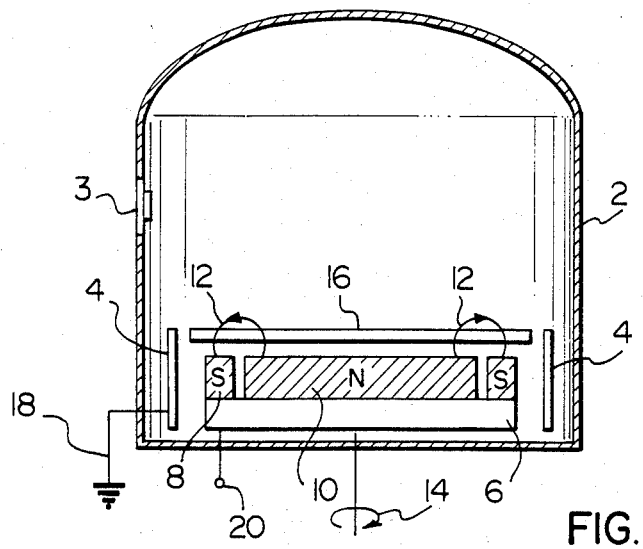
FIG. 1 is a diagrammatic representation of one embodiment of the invention.

In FIG. 1 there is diagrammatically illustrated, magnetron sputtering apparatus including a magnetron housing 2 and a magnetron sputter device 3. A grounded anode shield electrode 4 is located in the housing 2 together with the cathode electrode 6. A magnet assembly 8 and 10 is mounted on the cathode electrode 6, to produce a magnetic field 12, and the whole is capable of rotation as indicated by the arrow 14. A stationary target disc 16 is positioned a short distance from the magnet assembly and the cathode electrode so that, in operation, sputtering material from the cathode electrode 6 deposited on the surface of the target disc 16.

The anode shield electrode 4 is connected to ground potential at 18 whilst a negative potential of $-500$ to $-1000$ volts is applied to the cathode electrode by way of terminal 20.

During the sputtering operation, the magnet assembly 8, 10 is rotated constantly at a selected speed, such as 60 r.p.m., and the plasma track on the target 16 follows this rotation. Consequently target erosion takes place from a much larger area of the disc.

Figure 2:
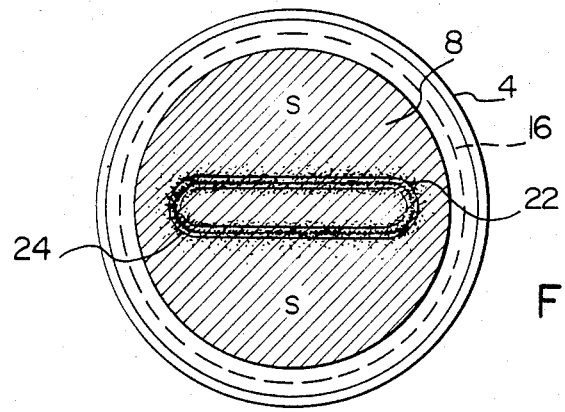
FIG. 2 is a diagrammatic plan view of the arrangement of FIG. 1.

If the magnetic field 12 was stationary, the target erosion during sputtering takes place only along the stationary track defined by the magnetic field 12. This can be seen more clearly from FIG. 2 which is a diagrammatic plan view representation of the arrangement within housing 2. The closed track of the air gap between the pole pieces 8 and 10 is identified as 22, whilst the plasma ring 24 is also shown and it will be seen that rotation of the magnet assembly results in rotation of the plasma track or ring 24 on the target.

The effect of the magnetic field 12 is to confine most of the plasma 24 along the closed track and it will be understood that a strongly magnetized air gap in the form of the closed track 22 is created at the surface of the target 16. The magnetic field 12 is, of course, created by suitably shaped magnets 8 and 10 which may be permanent or electro-magnets. As seen, the cathode target is located within the vacuum chamber formed by housing 2 and it was found that a stable plasma discharge was obtained at a suitable gas pressure, for example argon at $3 \times 10^{-4}$ Torr.

Figures 3, 4:
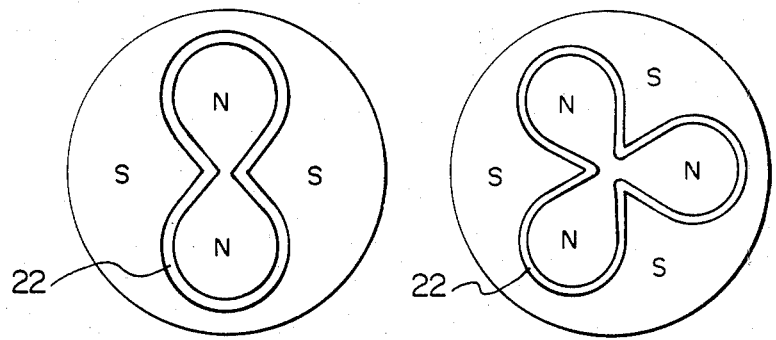
FIGS. 3 and 4 are diagrammatic representations of alternate magnetic tracks.

It was found that more complex shapes of the magnetic track 22 were possible. Two examples are diagrammatically illustrated in FIGS. 3 and 4 and in plan view they comprise a closed track formed from a plurality of petal-like outlines extending outwardly from a central location.

Figure 5:
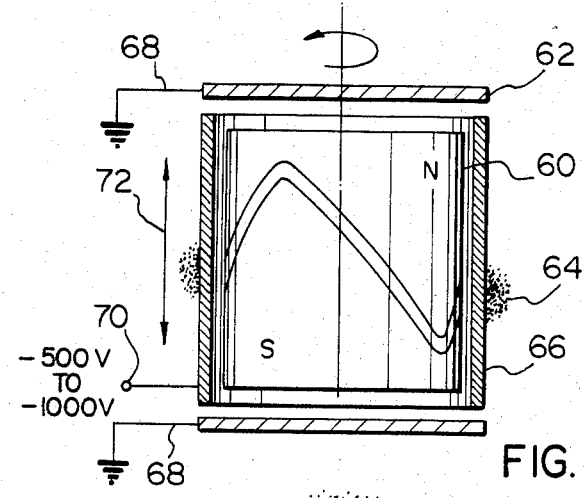
FIGS. 5, 6 and 7 are diagrammatic representations of an embodiment using a cylindrical target.
Figure 6:
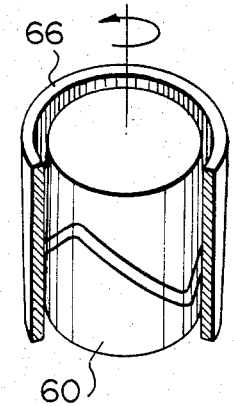
Figure 7:
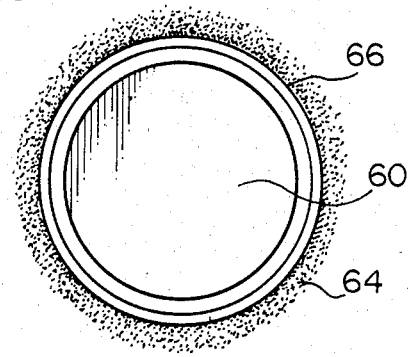

In FIG. 5 there is diagrammatically illustrated a cylindrical arrangement according to an embodiment of the invention. FIG. 6 is a partially cut-away perspective view and FIG. 7 is a diagrammatic plan view of this embodiment. In this embodiment the magnet 60 is cylindrical in shape and is magnetized such that the magnetic field follows a closed, endless track on the surface of the cylinder. This can be achieved either by magnetizing a solid cylinder with its neutral axis following the closed track or by having two complementary cylindrical sections of opposite magnetic polarity, separated by an air gap following the closed track. The natural lines of force are such that sputtering takes place along the neutral zone of the magnet 60. The target 66 is in the form of a hollow cylinder closely surrounding the magnet 60. The shield electrodes 62 are at ground potential as indicated at 68 whilst a negative potential, of $-500$ to $-1000$ volts, is applied at terminal 70 to the cylindrical target 66.

The plasma is indicated at 64 whilst the plasma sweep on the target is represented by arrow 72 and results from the reciprocating action of the magnetic field.

From the above it will be seen that different shapes and geometries of magnetron sputtering can be achieved.

When other parameters (magnetic field, pressure and potential) are kept constant, total power in the plasma appears to be proportional to the length of the track. The shape of the track and its sweep over the target determine the utilization efficiency, which could be as high as 80% for the circular disc.

During sputtering most of the power is generated as heat in the target. In the usual way, cooling is achieved by circulating water or other fluid behind the circular disc. The same fluid can be used to provide the power to rotate the magnet assembly by the use of a small water turbine wheel attached to the shaft. This could eliminate the provision of external rotary power.

The described embodiments using a simplified target shape, (e.g. circular disc) appear to provide the following advantages:

1. Higher yield from a given target. These are generally expensive especially when made from precious metals
2. Longer time of operation between target replacements
3. Easier availability of targets in simple shapes, such as a circular disc, without the need for bonding or special geometry
4. The technique is particularly applicable to thin film techniques in the microelectronic industry.

It will be readily apparent to a person skilled in the art that a number of variations and modifications can be made without departing from the true spirit of the invention which will now be pointed out in the appended claims.

What is claimed is:

1. Sputtering apparatus adapted to form a metallic film on a workpiece, comprising
    (a) a magnetron sputter device for establishing a glow discharge,
    (b) a cathode target of material to be sputtered so as to coat at least part of said workpiece with said material,
    (c) an anode at a different potential to said cathode target to form an electric field therebetween,
    (d) a magnet adjacent said cathode target,
    (e) an assembly supporting said magnet and capable of rotating said magnet to produce a rotating magnetic field in the vicinity of said cathode target and said workpiece, said magnet being disposed such that said magnetic field is substantially parallel to the surface of said target in the region to be sputtered.

2. Sputtering apparatus according to claim 1 wherein an air gap is provided in said magnet which in plan view comprises a spaced-apart pair of parallel straight lengths joined at each end by semi-circular portions to form a closed track.

3. Sputtering apparatus according to claim 1 wherein an air gap is provided in said magnet which in plan view comprises a closed track formed from a plurality of petal-like outlines extending outwardly from a central location.

4. Sputtering apparatus according to claim 1 wherein an air gap is provided in said magnet which in plan view is of closed-rectangular outline.

5. Sputtering apparatus according to claim 1 wherein the magnetic field is concentrated along a closed, endless track on the cylindrical surface, and the cathode target is a hollow cylinder closely surrounding the magnet.

6. Sputtering apparatus according to claim 1, 2 or 3 including means for cooling said cathode target by cooling fluid.

7. A method of forming a metallic film on a workpiece including the steps of
    (a) magnetron sputtering a cathode target and establishing a glow discharge,
    (b) establishing an electric field in the vicinity of said cathode target, and
    (c) establishing a magnetic field in the vicinity of said cathode target substantially parallel to the surface of said target in the region to be sputtered, and
    (d) rotating said magnetic field.

* * * * *